United States Patent [19]
Huang et al.

[11] Patent Number: 5,330,924
[45] Date of Patent: Jul. 19, 1994

[54] METHOD OF MAKING 0.6 MICROMETER WORD LINE PITCH ROM CELL BY 0.6 MICROMETER TECHNOLOGY

[75] Inventors: Heng S. Huang, Taipei; Kun-Luh Chen, Chu-nan; Te-Sun Wu; Han-Shen Lo, both of Chu-pei, all of Taiwan

[73] Assignee: United Microelectronics Corporation, Hsinchu, Taiwan

[21] Appl. No.: 154,789

[22] Filed: Nov. 19, 1993

[51] Int. Cl.⁵ .......................................... H01L 21/265
[52] U.S. Cl. .................................. 437/43; 437/50; 437/186; 437/984; 437/48
[58] Field of Search ................. 437/43, 48, 49, 50, 437/52, 191, 984, 53, 186

[56] References Cited

U.S. PATENT DOCUMENTS

| | | | |
|---|---|---|---|
| 4,839,305 | 6/1989 | Brighton | 437/41 |
| 4,855,248 | 8/1989 | Ariizumi et al. | 437/49 |
| 4,868,136 | 9/1989 | Ravaglia | 437/38 |
| 4,904,615 | 2/1990 | Okuyama et al. | 437/52 |
| 4,952,523 | 8/1990 | Fujii | 437/53 |
| 5,002,896 | 3/1991 | Naruke | 437/48 |
| 5,236,853 | 8/1993 | Hsue | 437/43 |
| 5,270,243 | 12/1993 | Tuan et al. | 437/52 |

*Primary Examiner*—George Fourson
*Assistant Examiner*—Richard A. Booth

*Attorney, Agent, or Firm*—George O. Saile; Stephan B. Ackerman

[57] ABSTRACT

A cost-effective and manufacturable method for producing ROM integrated circuits with closely-spaced self-aligned conductive lines, on the order of 0.3 micrometers apart, is described. Parallel, conductive semiconductor device structures are formed in a semiconductor substrate. An insulating layer is formed over the semiconductor substrate. A first conductive polysilicon layer is formed over the insulating layer. The first conductive polysilicon layer is patterned to form first polysilicon conductor lines which are parallel to each other, and orthogonal to the parallel, conductive semiconductor device structures. A first silicon oxide layer is formed on and between the first polysilicon conductor lines. The first silicon oxide layer is anisotropically etched to produce sidewall structures on the first polysilicon conductor lines. A second silicon oxide layer is formed on and between the first polysilicon conductor lines. A second conductive polysilicon layer is formed over the first polysilicon conductor lines and in openings between the first polysilicon conductor lines. The second conductive polysilicon layer is etched back to form second polysilicon conductor lines, parallel to, between and self-aligned with the first polysilicon conductor lines, and separated from the first polysilicon conductor lines by width of the sidewall structures.

31 Claims, 6 Drawing Sheets

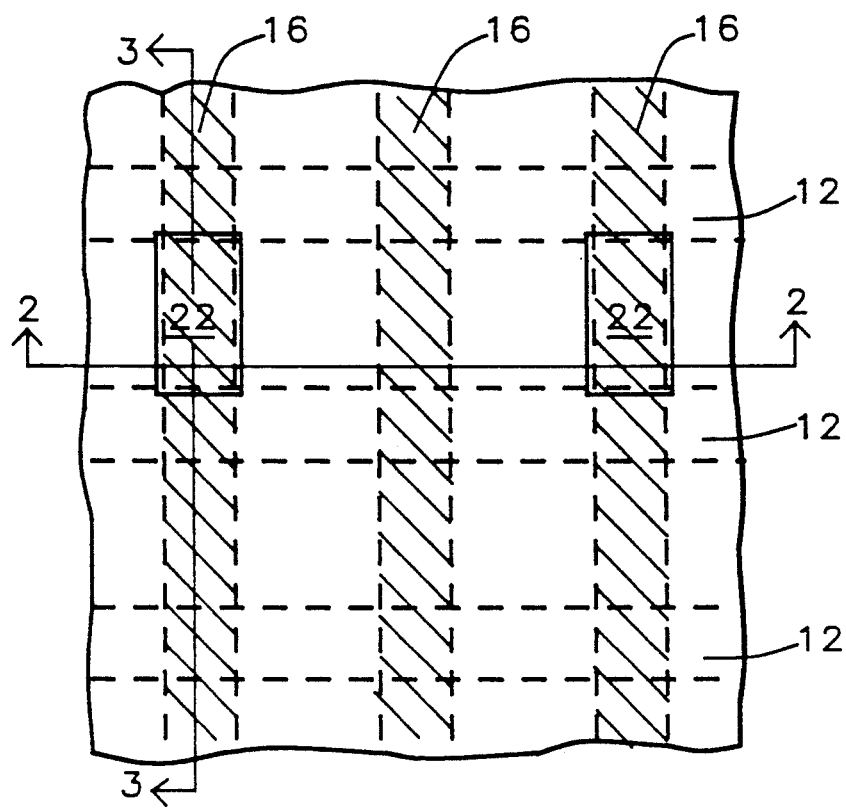
FIG. 1 – Prior Art
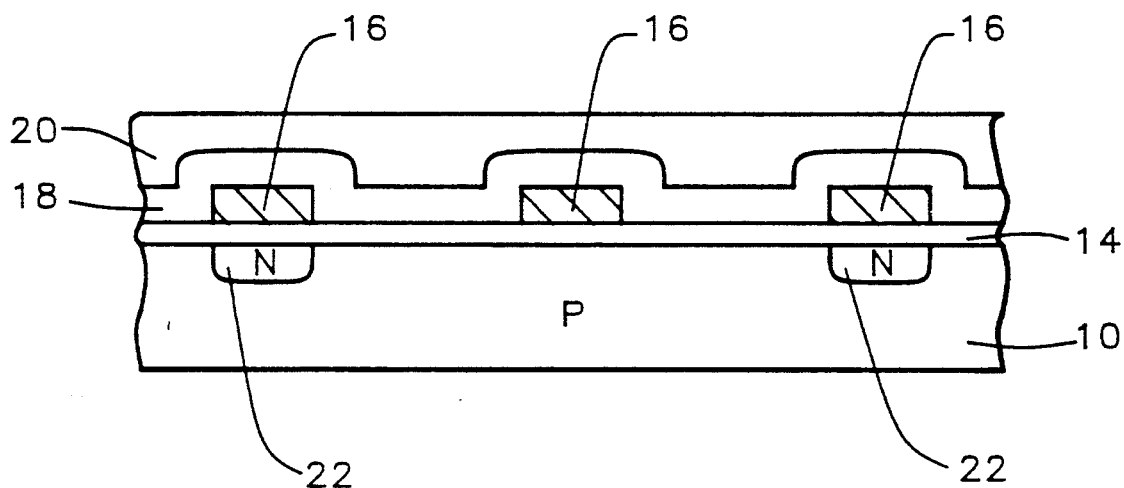
FIG. 2 – Prior Art

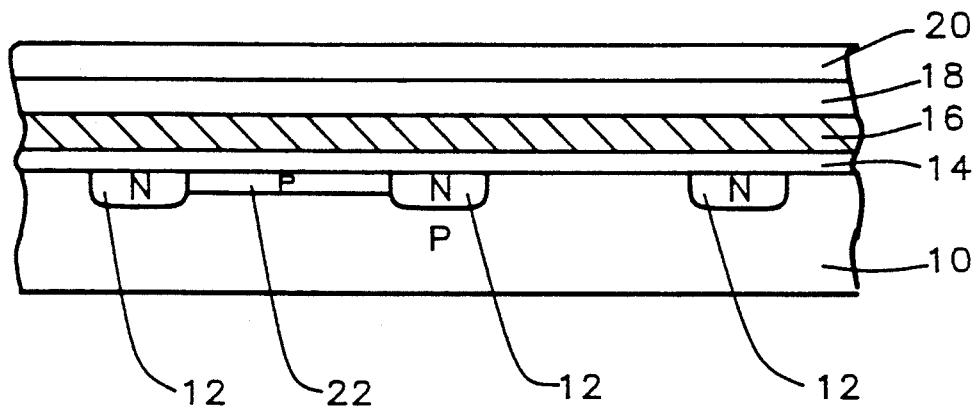
FIG. 3 — Prior Art
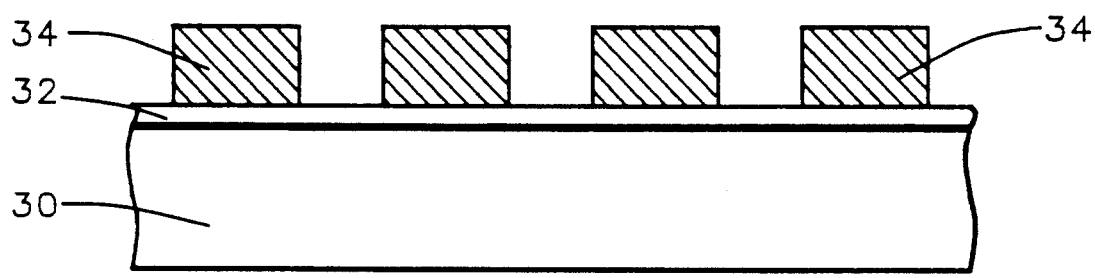
FIG. 4
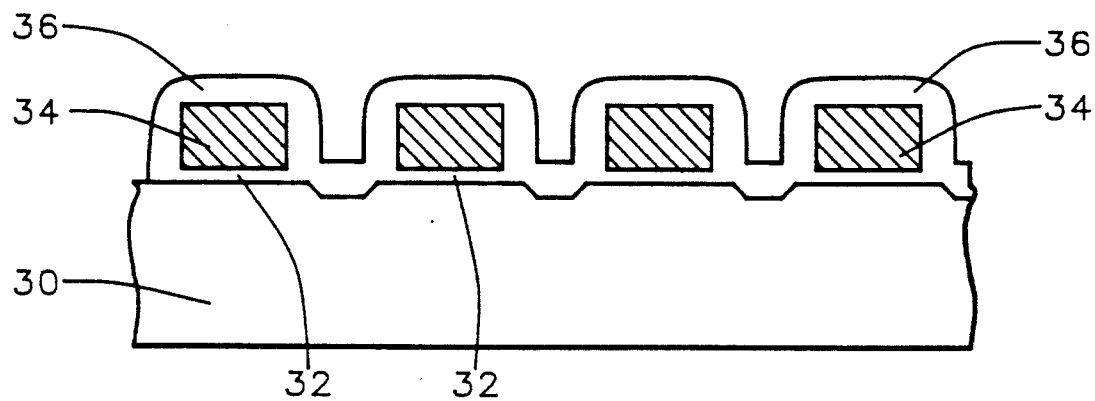
FIG. 5

METHOD OF MAKING 0.6 MICROMETER WORD LINE PITCH ROM CELL BY 0.6 MICROMETER TECHNOLOGY

BACKGROUND OF THE INVENTION (1) Field of the Invention

This invention relates to ROM (Read Only Memory) manufacturing techniques, and more particularly to the formation of closely spaced self-aligned word lines for use in ROM integrated circuits.

(2) Description of the Related Art

ROM devices are well known and widely used in the computer technology. In general, a ROM device is an array of MOSFETs (Metal Oxide Semiconductor Field Effect Transistor) arranged in columns and rows where selected MOSFETs are rendered permanently conductive, or non-conductive, depending on the type of transistor. The ability to set the conductive state of each MOSFET provides a means for storing binary information. In a ROM device, this information is maintained even when power is removed from the circuit.

A typical ROM structure is illustrated in FIGS. 1 to 3. A ROM device consists basically of a plurality of parallel, closely spaced, line regions 12, called "bit lines" formed of a heavily doped impurity in a semiconductor substrate 10 having an opposite type background impurity. An insulating layer 14 overlies the substrate 10. A plurality of parallel closely spaced conductive lines 16, called "word lines", arranged orthogonally to the line regions 12, are provided on the surface of the substrate 10 on layer 14. Suitable insulating layers 18 and 20 provide insulation for the lines 16. There is also provided a metallurgy layer (not shown) that operatively connects the line regions 12, and conductive lines 16 to suitable circuitry to address and interrogate the device array, which is well known in the art.

It can be seen that at the intersection of a word line 16 and a pair of bit lines 12, there is provided an MOSFET. The spaced line regions 12 are the source and drain, the conductive line 16 is the gate electrode, and the layer 14 is the gate insulation layer. Selected MOSFETs can be made permanently conductive by implanting, and activating by an annealing step, a region 22, of an impurity of an opposite type as lines 12, between adjacent lines 12 and beneath the conductive line 16. The regions 22 are called code implants and are placed in the substrate to encode specific binary information.

As the capacity of ROM devices has continued to increase, cell size and other critical dimensions must continually be reduced. One means of increasing the ROM capacity is to increase the density of the conductive lines in the ROM device. However, the line width and spacing between lines is limited by lithographic resolution.

Researchers in the integrated circuit field generally have used the sidewall technology to form smaller spaces than normally available through lithography for various purposes. Examples of this type of application are shown in U.S. Pat. No. 4,839,305 to J.K. Brighton, and U.S. Pat. No. 4,868,136 to A. Ravaglia.

However, in the read only memory field researchers have used two layer polysilicon structures to make more densely packed memories, such as described in Y. Naruke U.S. Pat. No. 5,002,896. While these have been successful, it is clear that a single layer, closely spaced technology would provide advantages over the two layer structures. One single layer method is disclosed by Hsue in U.S. Pat. No. 5,236,853. One advantage of the single layer structure is in the increased planarity of the surface compared to the planarity of a two layered structure. Other advantages are cost effectiveness and process simplicity. Also, characterization of the ROM can be achieved in a single code implant rather than two separate implant steps.

SUMMARY OF THE INVENTION

It is therefore an object of the invention to provide a cost-effective and manufacturable method for producing ROM or the like integrated circuits with closely-spaced self-aligned conductive lines, on the order of 0.3 micrometers apart.

This object is achieved by first forming parallel, conductive semiconductor device structures in a semiconductor substrate. An insulating layer is formed over the semiconductor substrate. A first conductive polysilicon layer is formed over the insulating layer. The first conductive polysilicon layer is patterned to form first polysilicon conductor lines which are parallel to each other, and orthogonal to the parallel, conductive semiconductor device structures. A first silicon oxide layer is formed on and between the first polysilicon conductor lines. The first silicon oxide layer is anisotropically etched to produce sidewall structures on the first polysilicon conductor lines. A second silicon oxide layer is formed on and between the first polysilicon conductor lines. A second conductive polysilicon layer is formed over the first polysilicon conductor lines and in openings between the first polysilicon conductor lines. The second conductive polysilicon layer is etched back to form second polysilicon conductor lines, parallel to, between and self-aligned with the first polysilicon conductor lines, and separated from the first polysilicon conductor lines by width of the sidewall structures.

BRIEF DESCRIPTION OF THE DRAWINGS

FIGS. 1 through 3 are a top view and two cross-sectional views, respectively, of a typical ROM device structure known in the prior art.

FIGS. 4, 5, 6, 6A and 6B are cross-sectional views of a first method of the invention for forming closely-spaced, self-aligned parallel conductive lines for a ROM integrated circuit.

DESCRIPTION OF THE PREFERRED EMBODIMENTS

Figure 6:
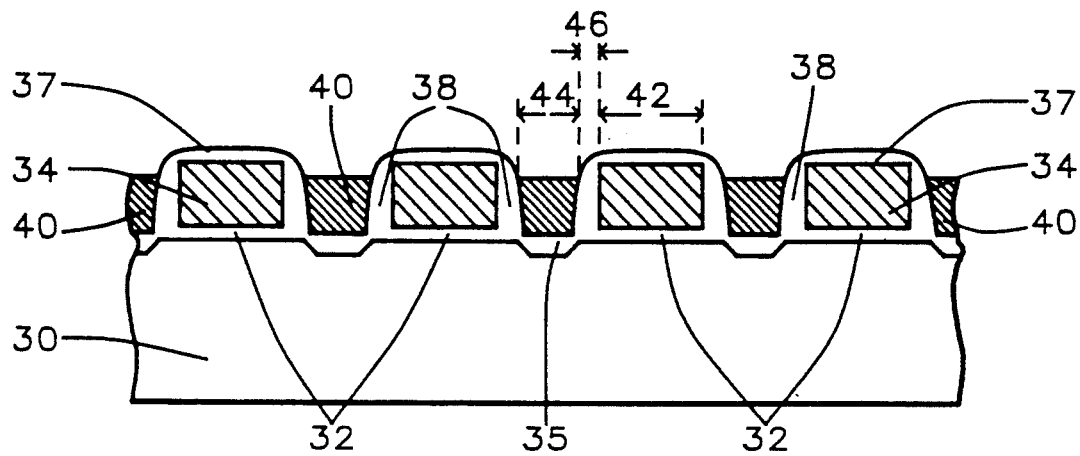

Referring now to the drawings, more particularly to FIGS. 4 through 8 there is illustrated a first method for the novel process for producing ROM devices. Referring now more particularly to FIG. 4, there is illustrated a partially completed ROM structure in which there is a monocrystalline silicon semiconductor substrate 30. In the substrate 30, there are diffused regions (not shown) which are typically heavily-doped N type source/drain regions as are known in the art. These regions are formed as parallel lines to be connected as bit lines or ground depending upon the particular need of the circuit. These structures are not specifically illustrated at this time, since they are in themselves known structures.

The insulating layer 32 is formed on top of the silicon substrate 30 with the ROM structure described above. The insulating layer 32 is composed of silicon oxide formed by conventional high temperature furnace process and has a thickness of between about 80 and 250 Angstroms.

A polysilicon layer is now formed on oxide layer 32 by low pressure chemical vapor deposition (LPCVD) to a thickness of between about 1500 and 4000 Angstroms. The polysilicon layer 34 is doped with phosphorus oxychloride ($POCl_3$) at 900° C. Alternatively, the polysilicon layer can be doped in situ, that is during its deposition. The polysilicon layer is then patterned by conventional lithography and etching to form parallel conductive lines 34, UMC2-93-026 as shown in the cross-sectional view of FIG. 4. These lines run orthogonally to the diffused N-type bit lines already formed in the substrate.

Referring now to FIG. 5, a layer of silicon oxide 36 is formed over the polysilicon lines 34 and over exposed areas of the substrate 30, by thermal oxidation at a temperature of between about 850° and 950° C., for between about 30 and 200 minutes. The resulting thickness of silicon oxide is between about 1500 and 3500 Angstroms, and wherein the thickness of the silicon oxide layer is the width of the planned spacing between word lines. Oxide layer 32 in the regions between the polysilicon lines 34, and a portion of the polysilicon conductive lines 34, are consumed during this step to become layer 36. Oxide layer 36 may also be formed by LPCVD. With reference to FIG. 6, an anisotropic etch is performed to leave sidewall spacers 38 on the sides of conductive lines 34.

A second gate oxide is now formed as part of the FIG. 6 structure since after the anisotropic etch a thin insulating layer 37 must be formed on the top surface of word lines 34, and also as layer 35 in the channel between the word lines. This second gate oxide is formed in a similar manner to oxide layer 32, and has a thickness of between about 80 and 250 Angstroms.

A second deposition of polysilicon is now performed by low pressure chemical vapor deposition (LPCVD) to a thickness of between about 1500 and 4000 Angstroms. This second polysilicon layer 40 is doped with phosphorus oxychloride ($POCl_3$) at 900° C. Alternatively, the polysilicon layer can be doped in situ. This second polysilicon layer is etched back by end-point-detected dry etching with little or no overetching, as shown in FIG. 6, to create a second set of parallel conductive lines 40. The width 42 and 44 of word lines 34 and 40 is between about 0.25 and 0.45 micrometers, while the spacing between the word lines is determined by the thickness of sidewall spacers 38, and is between about 0.15 and 0.35 micrometers. The combined width of 42 and 46, also known as the word line pitch (line width plus spacing), is desired to be kept at about 0.6 micrometers.

The resultant structure has closely-spaced self-aligned conductive lines that can be used as word lines for the ROM device. The word lines consist of two different polysilicon portions as a result of the above processing and provide good planarity at the top surface. For 0.6 micrometer (um) technology, the prior art would provide a 1.2 μm word line pitch, while the invention provides a 0.6 μm word line pitch with 0.3/0.3 μm width/spacing capability.

Figure 6A:
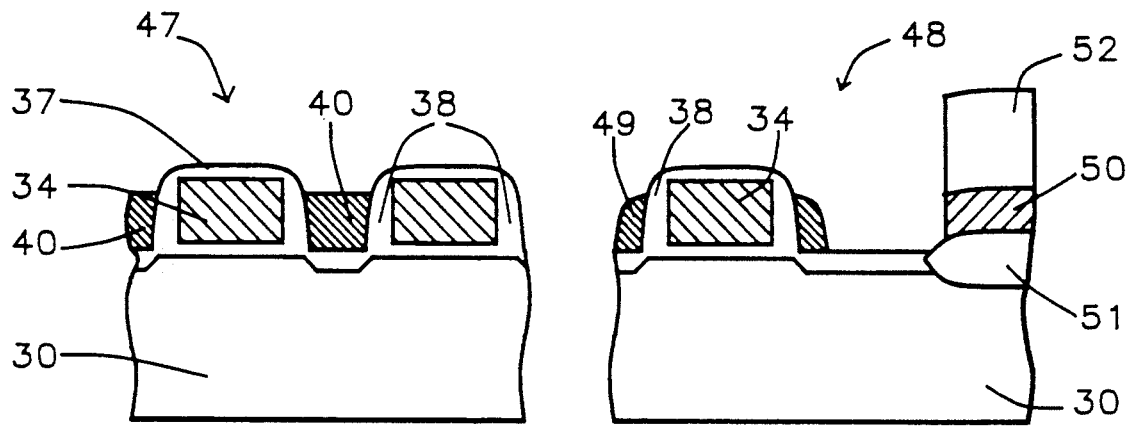
Figure 6B:
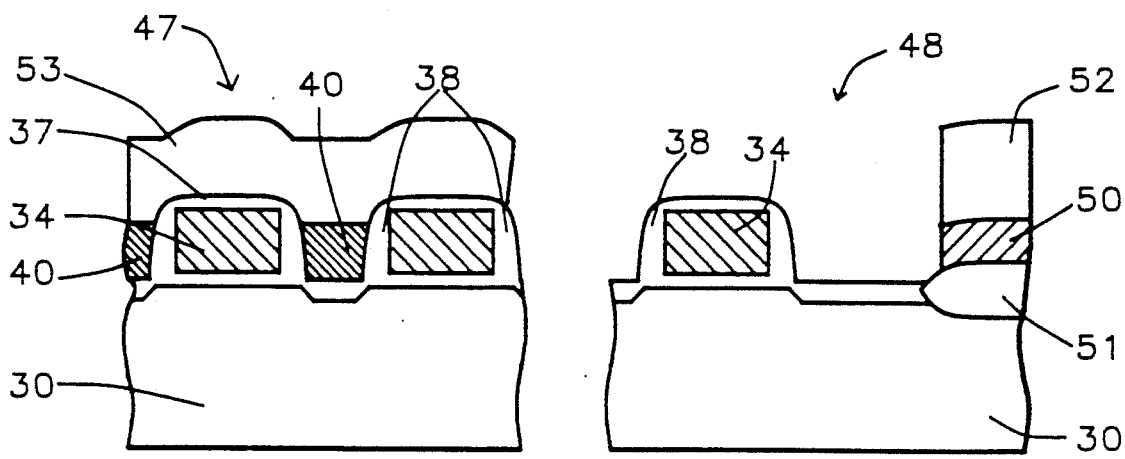

Different structures are formed in the cell region and the peripheral region of the ROM integrated circuit, which will be shown with reference to FIGS. 6A and 6B. The cell region 47 includes the MOSFET structures for data storage, while the peripheral region 48 includes circuits such as decoders, sense amplifiers and other logic circuits connected to the cell region devices. As shown in FIG. 6A, processing in the peripheral region 48 is the same as in the cell region 47, such that polysilicon lines 34 and spacers 38 are formed on substrate 30, except that second polysilicon layer 40 is removed by the anisotropic etch described above in all but spacer region 49 and in region 50. The second polysilicon layer left in region 50 is formed on field oxide region 51, formed previously by thermal oxidation as is well known in the art. Photoresist mask 52 is formed by conventional lithography to define region 50, which is used to connect word lines 40 in the cell region to peripheral circuits through later metallization.

Referring now to FIG. 6B, the cell region 47 is masked with an array protect mask 53, formed of a photoresist using conventional lithography. The second polysilicon spacers 49 are removed from the peripheral region of the ROM structure by an overetch, using a conventional overetching process, with either a dry or wet etch, and overtime process of 50 to 100%, to guarantee all spacers are removed. The masks are removed by conventional etching.

Figure 7:
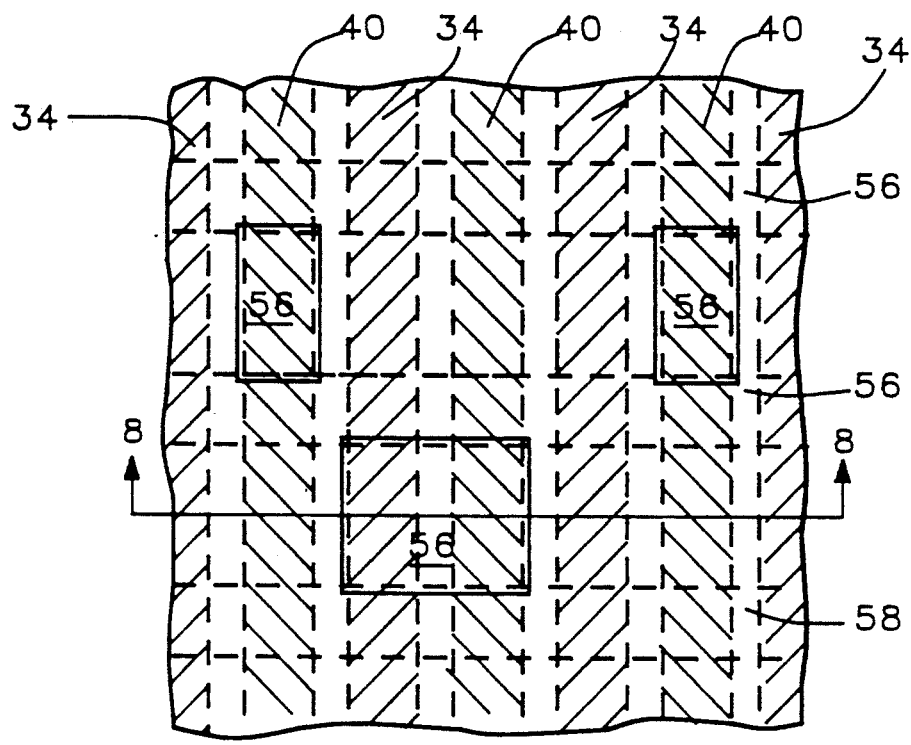
FIG. 7 is a top view of a code implant step for the ROM integrated circuit formed by the invention.
Figure 8:
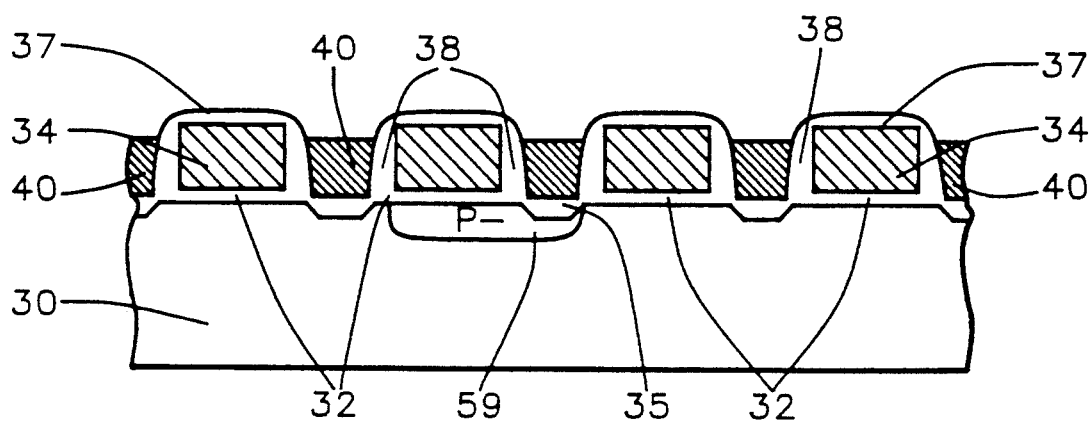
FIG. 8 is a cross-sectional view of FIG. 7 along line 8—8, after completion of the code implant.

FIG. 7 illustrates the top view of the ROM circuit formed with code implant windows 56 in relation to other elements of the read only memory. The code implant windows 56 are formed by depositing a photoresist over the wafer and using conventional lithography and etching to create the windows where characterization of the ROM is desired. Also shown are closely-spaced polysilicon word lines 34 and 40, and N+ bit lines 58 running orthogonally to the word lines. Only a single implant is required to characterize the ROM circuit. The characterization is achieved by an ion implant of boron B11 at an energy of between about 130 and 250 KeV and a dosage of between about 5 E 13 and 5 E 14 atoms/$cm^2$. FIG. 8 is a cross-sectional representation along line 8—8 of FIG. 7, after the boron implant creates P- region 59. Processing of the ROM circuit is then continued to complete the circuit, including metallization and passivation, as is well known in the art.

Figure 9:
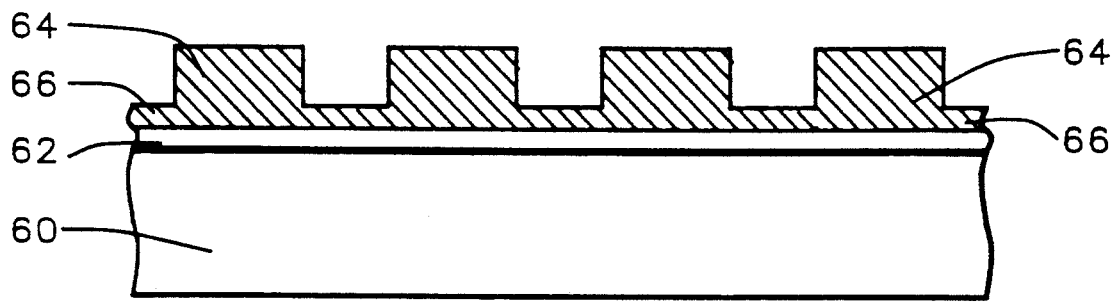
FIGS. 9 to 11 are cross-sectional views of a second method of the invention for forming closely-spaced, self-aligned parallel conductive lines for a ROM integrated circuit.

A second method is now described for forming the closely-spaced, self-aligned word lines of the invention. Referring to FIG. 9, a partially completed ROM structure is shown with substrate 60. Bit lines ( not shown ) have already been formed in the substrate of heavily-doped N type source/drain regions. The insulating layer 62 is formed on top of the silicon substrate 60 with the ROM structure described above, and is composed of silicon oxide having a thickness of between about 80 and 250 Angstroms, as in the first method above.

A polysilicon layer is now formed on oxide layer 62 by low pressure chemical vapor deposition (LPCVD) to a thickness of between about 2000 and 3000 Angstroms. The polysilicon layer is doped with phosphorus oxychloride ($POCl_3$) at 900° C. Alternatively, the polysilicon layer can be doped in situ, that is during its deposition. As shown in FIG. 9, a thin polysilicon layer 66 is formed simultaneously with, and between, parallel conductive lines 64, on oxide layer 62. This is accomplished by conventional lithography masking lines 64, and time-controlled etching of the polysilicon, such that the thickness of resulting layer 66 is between about 500 and 1000 Angstroms. Polysilicon lines 64 run orthogonally to the diffused N-type bit lines already formed in the substrate.

Figure 10:
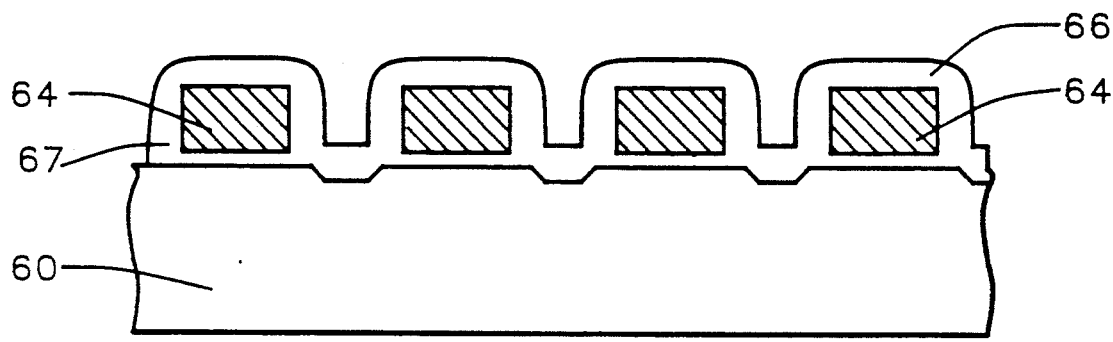
Figure 11:
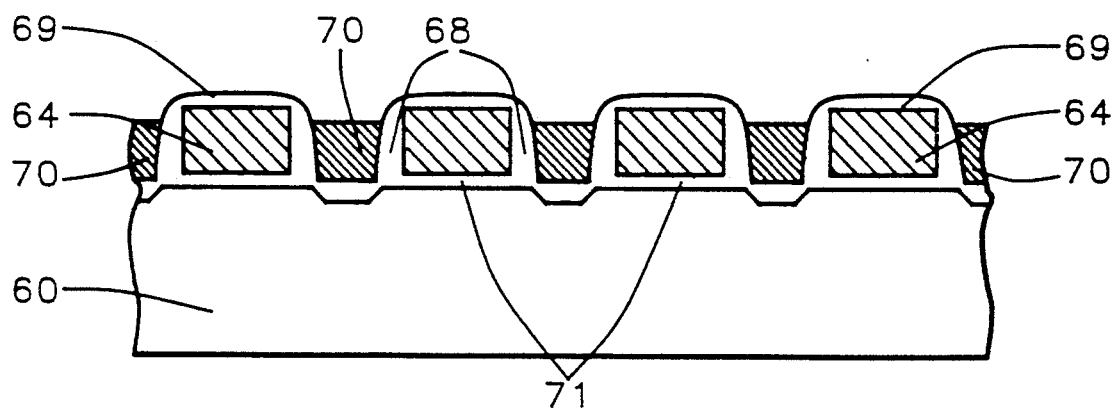

Referring now to FIG. 10, a layer of thermal silicon oxide 67 is formed over polysilicon lines 64 and over oxide layer 62, by thermal oxidation at a temperature of between about 800° and 1000° C., for between about 30 and 200 minutes. Thin polysilicon layer 66, portions of line 64, and portions of substrate 60 under oxide layer 62 are consumed during the oxidation process. The resulting thickness of silicon oxide is between about 1500 and 3500 Angstroms, and wherein the thickness of the silicon oxide layer is the width of the planned spacing between word lines. The formation of thin polysilicon layer 66 leads to a higher top surface of oxide 67 in the regions between conductive lines 64 than in the first method of the invention, leading to a more planar top surface as seen in FIG. 11. An anisotropic etch is now performed to leave sidewall spacers 68, shown in FIG. 11 on the sides of conductive lines 64.

A second gate oxide is now formed as part of the FIG. 11 structure as in the first method, resulting in thin insulating layer 69 on the top surface of word lines 64, and layer 71 in the channel between the word lines. This second gate oxide is formed in a similar manner to oxide layer 62, and has a thickness of between about 80 and 250 Angstroms.

A second deposition of polysilicon is now performed by low pressure chemical vapor deposition (LPCVD) to a thickness of between about 3000 and 5000 Angstroms. This polysilicon layer 70 is doped with phosphorus oxychloride (POCl$_3$) at 900° C. Alternatively, the polysilicon layer can be doped in situ. This polysilicon layer is etched back by endpoint-detected dry etching with little or no overetching to create the second set of parallel conductive lines 70 shown in FIG. 11. The width and spacing of word lines 64 and 70 is the same as in the first method, that is, between about 0.25 and 0.45 micrometers, while the spacing between the word lines is between about 0.15 and 0.35 micrometers, resulting in a word line pitch of about 0.6 micrometers.

Further processing now takes place to complete the ROM integrated circuit, as in the first method. The second polysilicon sidewall spacers are removed from the peripheral circuit by etching, code implant is performed, and metallization and passivation completed to finish the ROM circuit.

Figure 12:
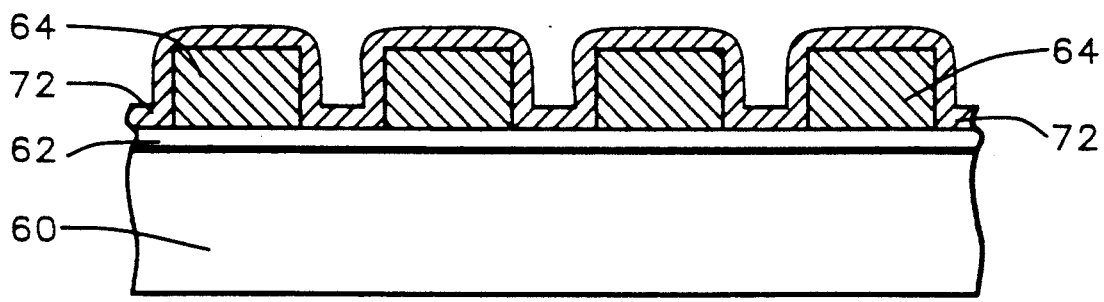
FIGS. 12 and 13 are cross-sectional views of a third method of the invention for forming closely-spaced, self-aligned parallel conductive lines for a ROM integrated circuit.
Figure 13:
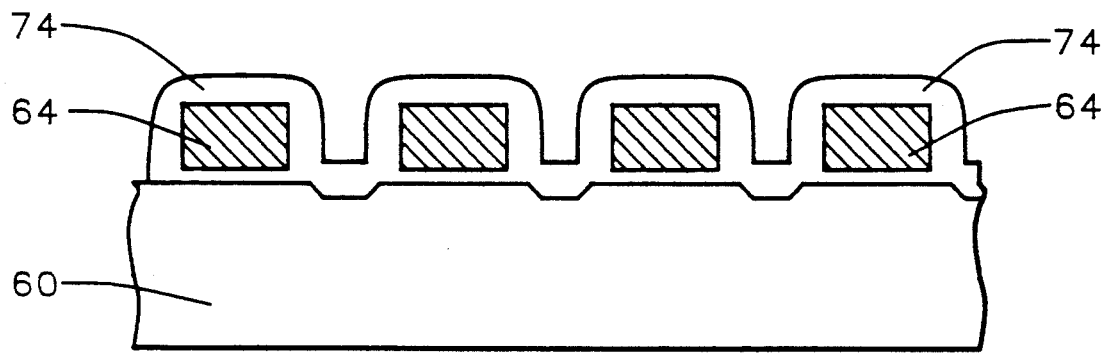

A third method of forming the closely-spaced, self-aligned word lines of the invention is shown in FIGS. 12 and 13. Similarly numbered elements from the second method are repeated. Referring to FIG. 12, parallel doped-polysilicon conductive lines 64 are formed as in the first method, to a thickness of between about 2000 and 3000 Angstroms. A thin polysilicon layer 72 is formed over the entire surface by LPCVD to a thickness of between about 500 and 1000 Angstroms. A layer of thermal silicon oxide 74 is formed over polysilicon lines 64 and over oxide layer 62, by thermal oxidation at a temperature of between about 800° and 1000° C., for between about 30 and 200 minutes. Thin polysilicon layer 66, portions of line 64, and portions of substrate 60 under oxide layer 62 are consumed during the oxidation process. The resulting thickness of silicon oxide is between about 1500 and 3500 Angstroms, and wherein the thickness of the silicon oxide layer is the width of the planned spacing between word lines. The formation of thin polysilicon layer 72 leads to a higher top surface of oxide 74 in the regions between conductive lines 64 than in the first method of the invention, leading to a more planar top surface as seen in FIG. 11. An anisotropic etch is now performed to leave sidewall spacers 68, shown in FIG. 11 on the sides of conductive lines 64.

Processing continues to completion of the circuit in an identical manner as in the second method. A second gate oxide is formed to a thickness of between about 80 and 250 Angstroms, and the second set of parallel, conductive word lines are formed to a thickness of between about 3000 and 5000 Angstroms. This polysilicon layer is doped with phosphorus oxychloride (POCl$_3$) at 900° C., resulting in the structure as shown in FIG. 11. Further processing now takes place to complete the ROM integrated circuit, as in the first and second methods. The second polysilicon sidewall spacers are removed from the peripheral circuit by etching, code implant is performed, and metallization and passivation completed to finish the ROM circuit.

Figure 14:
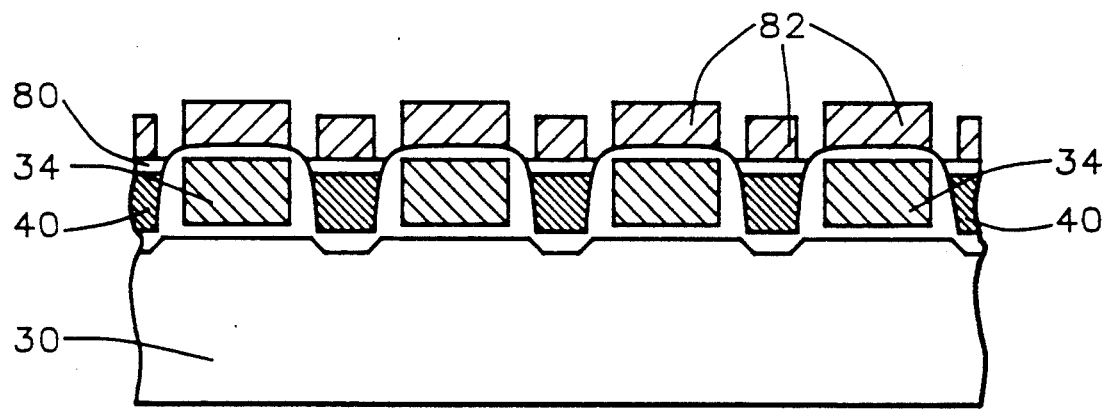
FIG. 14 is a cross-sectional view of an EPROM circuit using the method of the invention of forming closely-spaced, self-aligned parallel conductive lines.

The invention may also be used to form an EPROM (Electrically Programmable Read Only Memory), as shown in FIG. 14. Using either the FIG. 6 structure formed by the first method of the invention, or the FIG. 11 structure of the second and third methods, a thin oxide layer 80 is formed on the top surface of the structure by, for instance, thermal oxidation. A layer of polysilicon 82 is blanket deposited by LPCVD on layer 80 and is doped. Word lines 34 and 40 form the EPROM floating gate structures. Layer 82 is then etched by conventional lithography and etching, as self-alignment is not required, to form the EPROM control gates. Processing is then completed, including metallization and passivation, as is well known in the art to complete the EPROM circuit.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing closely spaced self-aligned polysilicon conductor lines in a ROM integrated circuit having cell and peripheral regions, comprising the steps of:

forming parallel, conductive semiconductor device structures in a semiconductor substrate;

forming an insulating layer over said semiconductor substrate;

forming a first conductive polysilicon layer over said insulating layer;

patterning said first conductive polysilicon layer to form first polysilicon conductor lines which are parallel to each other, and orthogonal to said parallel, conductive semiconductor device structures;

forming a first silicon oxide layer on and between said first polysilicon conductor lines;

anisotropically etching said first silicon oxide layer to produce sidewall structures on said first polysilicon conductor lines;

forming a second silicon oxide layer on and between said first polysilicon conductor lines;

forming a second conductive polysilicon layer over said first polysilicon conductor lines and in openings between said first polysilicon conductor lines; and etching back said second conductive polysilicon layer to form second polysilicon conductor lines, parallel to, between and self-aligned with said first polysilicon conductor lines, and separated from said first polysilicon conductor lines by the width of said sidewall structures.

2. The method of claim 1 wherein said semiconductor device structures include buried N conductivity type regions in said substrate, and said polysilicon conductor lines are connected as word lines.

3. The method of claim 1 wherein said first polysilicon layer has a thickness of between about 1500 and 4000 Angstroms.

4. The method of claim 1 wherein said second polysilicon layer has a thickness of between about 1500 and 4000 Angstroms.

5. The method of claim 1 wherein said first and second polysilicon conductor lines each have a width of between about 0.25 and 0.45 micrometers.

6. The method of claim 5 wherein said first polysilicon conductor lines are separated from said second polysilicon conductor lines by between about 0.15 and 0.35 micrometers.

7. The method of claim 6 wherein the sum of the width of said first and second polysilicon conductor lines and the separation between said first and second polysilicon conductor lines is about 0.6 micrometers.

8. The method of claim 1 further comprising the steps of:
masking the cell region of said ROM integrated circuit with an array protect mask, after said etching back said second conductive polysilicon layer; and
removing the remainder of said second conductive polysilicon layer from the peripheral region of said ROM integrated circuit, by an overetch.

9. The method of claim 1 wherein said closely spaced self-aligned polysilicon conductor lines are used as word liens, said parallel, conductive semiconductor device structures are buried N conductivity type regions connected as bit and ground lines, and control gate and gate dielectric structures are provided, and said lines and structures are connected as a EPROM integrated circuit.

10. The method of claim 1 wherein during said patterning said first conductive polysilicon layer, a third polysilicon layer is formed on said insulating layer between said first polysilicon conductor lines.

11. The method of claim 10 wherein said third polysilicon layer is formed to a thickness of between about 500 and 1000 Angstroms.

12. The method of claim 10 wherein said first polysilicon layer has a thickness of between about 2000 and 3000 Angstroms.

13. The method of claim 10 wherein said second polysilicon layer has a thickness of between about 2000 and 3000 Angstroms.

14. The method of claim 10 wherein said first and second polysilicon conductor liens each have a width of between about 0.25 and 0.45 micrometers.

15. The method of claim 14 wherein said first polysilicon conductor lines are separated from said second polysilicon conductor lines by between about 0.15 and 0.35 micrometers.

16. The method of claim 15 wherein the sum of the width of said first and second polysilicon conductor lines and the separation between said first and second polysilicon conductor lines is about 0.6 micrometers.

17. The method of claim 11 further comprising the edges of:
masking the cell region of said ROM integrated circuit with an array protect mask, after said etching back said second conductive polysilicon layer; and
removing the remainder of said second conductive polysilicon layer from the peripheral region of said ROM integrated circuit, by an overetch.

18. The method of claim 1 further comprising the step of forming a third polysilicon layer over said first polysilicon conductor lines and on said insulating layer between said first polysilicon conductor lines.

19. The method of claim 18 wherein said third polysilicon layer is formed to a thickness of between about 500 and 1000 Angstroms.

20. The method of claim 18 wherein said first polysilicon layer has a thickness of between about 2000 and 3000 Angstroms.

21. The method of claim 18 wherein said second polysilicon layer has a thickness of between about 2000 and 3000 Angstroms.

22. The method of claim 10 wherein said first and second polysilicon conductor liens each have a width of between about 0.25 and 0.45 micrometers.

23. The method of claim 22 wherein said first polysilicon conductor lines are separated from said second polysilicon conductor lines by between about 0.15 and 0.35 micrometers.

24. The method of claim 23 wherein the sum of the width of said first and second polysilicon conductor lines and the separation between said first and second polysilicon conductor lines is about 0.6 micrometers.

25. The method of claim 11 further comprising the edges of:
masking the cell region of said ROM integrated circuit with an array protect mask, after said etching back said second conductive polysilicon layer; and
removing the remainder of said second conductive polysilicon layer from the peripheral region of said ROM integrated circuit, by an overetch.

26. A method of manufacturing a ROM integrated circuit, having cell and peripheral regions, using closely spaced self-aligned polysilicon conductor lines, comprising the steps of:
forming parallel buried N conductivity type regions in a semiconductor substrate;
forming an insulating layer over said semiconductor substrate;
forming a first conductive polysilicon layer over said insulating layer;
patterning said first conductive polysilicon layer to form first polysilicon conductor lines which are parallel to each other, and orthogonal to said parallel, buried N+ regions;
forming a first silicon oxide layer on and between said first polysilicon conductor lines;
anisotropically etching said first silicon oxide layer to produce sidewall structures on said first polysilicon conductor lines;
forming a second silicon oxide layer on and between said first polysilicon conductor lines;
forming a second conductive polysilicon layer over said first polysilicon conductor lines and in openings between said first polysilicon conductor lines;

etching back said second conductive polysilicon layer to form second polysilicon conductor lines, parallel to, between and self-aligned with said first polysilicon conductor lines, and separated from said first polysilicon conductor lines by the width of said sidewall structures; and electrically connecting said first and second polysilicon conductor lines and said buried N conductivity type regions to complete the ROM integrated circuit.

27. The method of claim 26 wherein said first polysilicon layer has a thickness of between about 1500 and 4000 Angstroms and said second polysilicon layer has a thickness of between about 1500 and 4000 Angstroms.

28. The method of claim 26 wherein said first and second polysilicon conductor lines each have a width of between about 0.25 and 0.45 micrometers.

29. The method of claim 28 wherein said first polysilicon conductor lines are separated from said second polysilicon conductor lines by between about 0.15 and 0.35 micrometers.

30. The method of claim 29 wherein the sum of the width of said first and second polysilicon conductor lines and the separation between said first and second polysilicon conductor lines is about 0.6 micrometers.

31. The method of claim 26 further comprising the steps of:

masking the cell region of said ROM integrated circuit with an array protect mask, after said etching back said second conductive polysilicon layer; and removing the remainder of said second conductive polysilicon layer from the peripheral region of said ROM integrated circuit, by an overetch.

* * * * *